United States Patent [19]

Etherington et al.

[11] Patent Number: 5,254,431
[45] Date of Patent: Oct. 19, 1993

US005254431A

[54] RADIATION-SENSITIVE POLYMERS HAVING SULFONYL URTHANE SIDE CHAINS AND AZIDE CONTAINING SIDE CHAINS IN A MIXTURE WITH DIAZO COMPOUNDS CONTAINING

[75] Inventors: Terence Etherington, Leeds; Victor Kolodziejczyk, Bradford, both of United Kingdom

[73] Assignee: Vickers plc, London, England

[21] Appl. No.: 980,429

[22] Filed: Nov. 23, 1992

Related U.S. Application Data

[63] Continuation of Ser. No. 849,825, Mar. 11, 1992, abandoned, which is a continuation of Ser. No. 304,518, Jan. 31, 1989, abandoned.

[30] Foreign Application Priority Data

Feb. 3, 1988 [GB] United Kingdom ............... 8802314

[51] Int. Cl.$^5$ .................... G03F 7/012; G03F 7/016; G03F 7/021; C08F 8/00
[52] U.S. Cl. .................... 430/171; 430/157; 430/167; 430/175; 430/176; 430/195; 430/197; 430/325; 430/906; 525/58; 525/59; 525/293; 525/301; 525/502; 525/528; 522/32; 522/149; 552/8
[58] Field of Search ............... 430/167, 195, 197, 325, 430/171, 175, 176, 157, 906; 525/58, 59, 293, 301, 502, 528; 552/8; 522/149, 32

[56] References Cited

U.S. PATENT DOCUMENTS

| | | | |
|---|---|---|---|
| 2,870,011 | 1/1959 | Robertson et al. | 430/195 |
| 2,948,610 | 8/1960 | Merrill et al. | 430/195 |
| 3,002,003 | 9/1961 | Merrill et al. | 430/195 |
| 3,843,603 | 10/1974 | Gates | 430/287 |
| 3,911,164 | 10/1975 | Sayrigh et al. | 430/195 |
| 4,177,073 | 12/1979 | Hata et al. | 430/195 |
| 4,387,151 | 6/1983 | Bosse et al. | 430/197 |
| 4,588,669 | 5/1986 | Asano | 430/195 |
| 4,857,428 | 8/1989 | Koike | 430/197 |
| 5,008,362 | 4/1991 | Wilharm et al. | 430/192 |

FOREIGN PATENT DOCUMENTS

2018779 10/1979 United Kingdom ............... 430/195

OTHER PUBLICATIONS

Chemical Abstracts 4079h vol. 74, 1971.

*Primary Examiner*—Richard L. Schilling
*Assistant Examiner*—John S. Chu
*Attorney, Agent, or Firm*—Harness, Dickey & Pierce

[57] ABSTRACT

A radiation sensitive material suitable for the production of radiation sensitive plates for lithographic printing plate manufacture comprises a polymer having appendent azide-substituted aromatic ester groups and sulphonyl urethane groups. The radiation sensitive compound is produced by a process in which some hydroxyl and/or epoxide groups of a polymer are reacted with an azide substituted carboxylic acid or ester forming derivative thereof, and some hydroxyl groups are reacted with a sulphonyl isocyanate.

6 Claims, No Drawings

RADIATION-SENSITIVE POLYMERS HAVING SULFONYL URTHANE SIDE CHAINS AND AZIDE CONTAINING SIDE CHAINS IN A MIXTURE WITH DIAZO COMPOUNDS CONTAINING

This is a continuation of U.S. patent application Ser. No. 849,825, filed Mar. 11, 1992, now abandoned, a continuation of U.S. patent application Ser. No. 304,518, filed Jan. 31, 1989, now abandoned.

This invention relates to radiation-sensitive compounds and more particularly, but not exclusively, is concerned with radiation-sensitive compounds for use in the manufacture of radiation-sensitive plates for lithographic printing plate production.

Radiation-sensitive plates comprising a substrate coated with a radiation-sensitive composition are well known in the production of lithographic and other types of printing plate, and similar compositions are used for other purposes such as photoresists.

In use, the composition is image-wise exposed to radiation so that parts of the composition are struck by radiation and parts are not. The radiation and non-radiation struck parts have differing solubilities in developer liquids, and thus the more soluble parts can be selectively removed by application of such a liquid.

As is well known, radiation-sensitive compounds are considered to be either positive working or negative working, depending on whether the affect of the radiation is to increase or decrease the solubility of the compounds. Negative-working compounds commonly are based on photo cross-linkable compounds (e.g. cinnamate type materials) or the so called diazo resins. The former provide printing plates having a good printing run length which is capable of being substantially increased by baking the exposed compound. They also have a reasonable sensitivity. However, they have the disadvantage, which is becoming increasingly important, that an organic solvent has to be used as the developer liquid. Diazo resins are of comparable sensitivity but have the disadvantage that the printing run length is substantially lower, and moreover, they cannot be baked to increase the run length of printing plates made therefrom. Their main advantage is that they can be developed in an aqueous-based developer liquid.

It is an object of the present invention to provide a radiation-sensitive compound which, without loss in sensitivity, has the aqueous developability characteristics of the diazo resins, and the run length characteristics, including the capability of being baked, of the photo cross-linkable compounds.

According to one aspect of the invention, there is provided a radiation-sensitive compound comprising a polymer including a plurality of azide-substituted aromatic ester groups and a plurality of sulphonyl urethane groups.

According to another aspect of the present invention there is provided a process for the production of a radiation sensitive compound which comprises providing a polymer including a plurality of hydroxyl groups and optionally epoxide groups; reacting an azide-substituted aromatic carboxylic acid, or ester-forming derivative thereof, with some of the hydroxyl groups and/or at least some of the epoxide groups if present; and reacting a sulphonyl isocyanate with at least some of the hydroxyl groups.

Generally, the radiation-sensitive compound may be prepared by mixing together solutions in suitable solvents of appropriate molar quantities of the starting polymer and the sulphonyl isocyanate, continuing the reaction until no residual isocyanate is present, adding an appropriate molar quantity of azide-substituted acid or ester forming derivative thereof, carrying out the reaction for 1-6 hours at a temperature of from ambient to 60° C., filtering off insoluble by-products, isolating by drowning-out into a suitable non-solvent, filtering, washing as necessary, and drying.

The ester-forming derivative of the azide-substituted aromatic carboxylic acid may be the acid chloride or acid anhydride.

Preferably the azide substituted aromatic carboxylic acid has the general formula

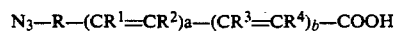

wherein a, b, R, $R^1$, $R^2$, $R^3$ and $R^4$ have the meanings given below and preferably the sulphonyl isocyanate has the general formula

wherein $R^6$ has the meaning given below.

Particulary preferred polymers are:

1. Poly (vinyl acetate) or copolymers of vinyl acetate with other vinyl monomers and which have been at least partially saponified, and esters or acetal derivatives of such saponified materials. Examples of such polymers are poly (vinyl alcohols) having between 80% and 100% (by weight) vinyl alcohol units and molecular weights of approximately 50,000 and poly (vinyl butyrals) and other poly (vinyl acetals) having at least 10% by weight of vinyl alcohol units and molecular weights in the range 20,000 to 80,000.

2. Epoxy resins which are condensation products of epichlorohydrin with aromatic hydroxy compounds such as bisphenol A and which have molecular weights in the range of 900 to 5,000.

3. Poly (meth) acrylate esters and in particular those derived from 2-hydroxy propyl methacrylate or 2-hydroxy ethyl methacrylate.

4. Copolymers containing free hydroxyl groups such as styrene-allyl alcohol copolymers;

5 Novolak resins which are the condensation products of phenols or cresols with formaldehyde.

6. Polymers derived from vinyl phenols.

In a preferred embodiment, the azide-substituted aromatic ester groups are of the general formula:

attached to carbon atoms of the polymer wherein a and b are zero or 1 and a+b is at least 1; R represents an aromatic radical optionally substituted with a group or groups additional to the azido group; and $R^1$, $R^2$, $R^3$ and $R^4$, which may be the same or different, represent halogen atoms, hydrogen atoms, cyano groups, alkyl groups, aryl groups, alkoxy groups, aryloxy groups, aralkyl groups or aralkoxy groups provided that at least one of the groups $R^1$ to $R^4$ represents a halogen atom or a cyano group.

Particularly preferred are ester groups derived from the following acids:
4-azido-α-bromo-δ-chlorocinnamylidene acetic acid
4-azido-α-chlorocinnamylidene acetic acid
4-azido-α-cyano-δ-chlorocinnamylidene acetic acid
4-azido-α-cyano-cinnamylidene acetic acid 3-azido-benzylidene-α-cynaoacetic acid
4-azido-2-chlorobenzylidene-α-cyanoacetic acid
4-azido-3,5-dibromobenzylidene-α-cyanoacetic acid
3-azido-4-methyl-benzylidene-α-cyanoacetic acid
3-azido-4-methoxybenzylidene-α-cyanoacetic acid
4-azido-benzylidene-α-bromo-cyanoacetic acid
4-azidobenzylidene-α-cyanoacetic acid
4-azido-3-chlorobenzylidene-α-cyanoacetic acid
and azide substituted N-phenyl anthranilic acids such as

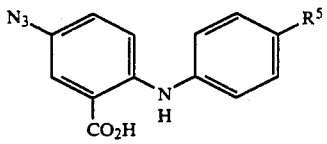

where $R^5$ = hydrogen, methyl, methoxy or chlorine.

Optionally, the polymer may also have attached thereto ester groups derived from non-azido-group containing aliphatic or aromatic carboxylic acids such as propionic acid, benzoic acid or octanoic acid.

If the acids themselves are used to esterify the hydroxy and/or epoxide groups, reagents such as di(cyclohexyl) carbodiimide may be used to promote esterification. If the acid chloride or acid anhydride is used, then suitable acid binders or catalysts may be required, such as pyridine, sodium carbonate or sodium acetate.

In a preferred embodiment, the sulphonyl urethane groups are of the general formula:

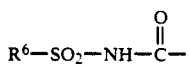

attached to carbon atoms of the polymer where $R^6$ may be alkyl, alkoxy, aryloxy, or a tertiary amine group substituted with an alkyl or acyl radical having 1-6 C atoms or an aryl radical having 6-10 C atoms.

Particularly preferred are sulphonyl urethane groups derived from benzene sulphenyl isocyanate, p-chlorobenzene sulphonyl isocyanate, p-toluene sulphonyl isocyanate and propenyl sulphonyl isocyanate.

Whilst the compounds of the invention may be used as the sole radiation-sensitive compound in compositions for use in the manufacture of printing plates or for use as photoresists, they may be also used in conjunction with other radiation-sensitive compounds.

Accordingly a further aspect of the present invention comprises a radiation-sensitive composition comprising a radiation-sensitive compound as defined above, and at least one other radiation-sensitive compound.

Preferably, said other radiation sensitive compound is a diazo compound such as is defined in European patent specification No. 30862 or as is produced by the condensation of diazo diphenyl amine and formaldehyde.

The following Examples illustrate the invention.

EXAMPLE 1

Preparation of the Radiation-Sensitive Compound 40g of poly (vinyl butyral) containing 74% by weight of vinyl butyral units, 2% by weight of vinyl acetate units and 24% by weight of vinyl alcohol units and having an approximate average molecular weight of 30,000, were dissolved in 500 cm$^3$ of anhydrous methyl acetate at 40° C. To this solution, 28.5g of p-toluene sulphonyl isocyanate (TSI) dissolved in 40 cm$^3$ of methyl acetate were added over the course of 15 minutes at 40° C. The reaction was allowed to continue for a further hour at 40° C. with stirring. 13.0g of 4-azidobenzylidene-α-cyano acetic acid were added followed by 12.46g of 1,3-dicyclo hexyl carbodiimide (DCC) dissolved in 40 cm$^3$ of methyl acetate and finally 0.1g of 4-dimethylamino pyridine (DMAP). The reaction mixture was then refluxed for 3 hours and then cooled to ambient temperature whilst being stirred. The insoluble 1,3-dicyclo hexyl urea produced was removed by filtration and the filtrate was sprayed into 5 litres of water to isolate the product. The resulting fibrous precipitate was filtered off, washed with 3 litres of aqueous 1% w/w potassium carbonate solution to remove any free acid and then re-slurried into water 3 times. The final product was dried at 35° C. to constant weight.

Analysis of the dried product by a combination of HPLC and Gel Permeation Chromatography (GPC), using U.V. detection at both 245 nm and 364 nm, confirmed that very little (<2% w/w) monomeric materials (i.e. starting materials or their monomeric derivatives) were present. The polymeric component was, however, found to absorb strongly at these wavelengths, thereby confirming that considerable reaction had taken place. Quantification of the aromatic azide containing ester content by UV spectrophotomeric analysis indicated the presence of 13.8 mol % ester. Titration of a THF solution of the product with 0.1M KOH determined an acid value of 65 (mg/g KOH).

These analyses are recorded in Table 1.

Preparation of a Printing Plate 2.6g of the above product and 0.06g of Victoria Pure Blue BO dye were dissolved in 100cm$^3$ of ethylene glycol monomethyl ether. After filtering to remove any solids, the solution was whirler-coated onto a sheet of electrograined and anodised aluminium to give a dry coating weight of 0.7-0.9gm$^{-2}$.

The plate was exposed and developed and the sensitivity and development characteristics are shown in Table 1.

EXAMPLE 2

Preparation of a Printing Plate 0.7g of the polymer prepared as in Example 1, 1.9g of a diazo compound as described in Example 1 of European patent specification No. 30862 and 0.06g of Victoria Pure Blue BO were dissolved in ethylene glycol monomethyl ether, and the solution was used to prepare a printing plate as described in Example 1. The sensitivity and developability characteristics are set out in Table 1.

EXAMPLE 3

Preparation of the Radiation Sensitive Compound 20g of an epoxy resin obtained by condensing epichlorohydrin and bispenol A and having a molecular weight of 1400 were dissolved in 115 cm$^3$ of anhydrous methyl acetate and 6.27g of TSI dissolved in 20cm$^3$ of methyl acetate were added over a period of 15 minutes at ambient temperature.

The reaction mixture was refluxed for 3 hours and then cooled to ambient temperature. 3.0g of 4-azido benzylidene-α-cyano acetic acid, followed by 2.84g of DCC dissolved in 20cm$^3$ of methyl acetate and 0.05g of 4-dimethyl amino pyridine were added. The reaction mixture was refluxed for 3 hours and then 2.31g of octanoyl chloride and 1.25g of pyridine were added and the mixture was further refluxed for 2 hours. The final product was recovered as in Example 1 except that the drowning-out step was carried out using propan-2-ol. After drying at 35° C. to constant weight, the product was analysed as in Example 1. The analysis results are recorded in Table 1.

Preparation of a Printing Plate

A printing plate using the above product was prepared in the same way as in Example 1. The characteristics are set out in Table 1.

EXAMPLE 4

Preparation of the Radiation Sensitive Compound 10g of the epoxy resin of Example 3 were dissolved in 50 cm$^3$ of dichloromethane. 3.73 cm$^3$ of TSI dissolved in 10cm$^3$ of dichloromethane were added to this solution over the course of a 15 minute interval at ambient temperature. The reaction was allowed to continue for a further two and a half hours with stirring. A solution prepared from 2.86g of 4-azido benzylidene-α-cyano acetic acid chloride in 25cm$^3$ of dichloromethane was added followed by 1.09cm$^3$ of pyridine. The reaction mixture was then refluxed for two and a half hours and then cooled to ambient temperature. The insoluble pyridine hydrochloride was removed by filtration and the filtrate was sprayed into 1500cm$^3$ of propan-2-ol to isolate the product which was then filtered off, reslurried in 1000cm$^3$ of propan-2-ol, filtered again and dried at 35° C. The product was analysed as in Example 1 and the analysis results recorded in Table 1.

Preparation of a Printing Plate

A printing plate using the above product was prepared in the same way as in Example 1. The characteristics of the printing plate are shown in Table 1.

EXAMPLES 5 to 16

Radiation sensitive compounds based on various startinq materials were produced by the above methods, analysed according to the description in Example 1 and printing plates prepared. The results are shown in Table 1.

Table 1 gives the following data in addition to the Example number.

Column 1: starting polymer type

Type A = polyvinyl butyral containing 74% by weight of vinyl butyral units, 2% by weight of vinyl acetate units and 24% by weight of vinyl alcohol units and having a molecular weight of 30,000

Type B = epoxy resin derived from the condensation of bisphenol A and epichlorhydrin and having a molecular weight of 1400

Type C = polyvinyl butyral containing 80% by weight vinyl butyral units and 20% by weight of vinyl alcohol units and having a molecular weight of 60,000

Type D = cresol-formaldehyde resin having a softening temperature of 150°-160° C.

Type E = styrene/allyl alcohol co-polymer containing 5-7% by weight hydroxyl groups and having a molecular weight of 2,500

Column 2: azide-substituted acid type, percentage by weight of ester groups present, molar percentage of acid charged Type 1 = 4-azido benzylidene-α-cyano acetic acid (λ max 345 nm)

Type 2 = 4-azido benzylidene-α-cyano acetic acid chloride (λ max 345 nm)

Type 3 = 3-chloro 4 azido benzylidene-α-cyano acetic acid (λ max 348 nm)

Type 4 = 5-azido N-phenyl anthranilic acid (λ max 356 nm)

Type 5 = 4-azido-α-cyano-δ-chlorocinnamylidene acetic acid (λ max 375 nm)

Column 3: sulphonyl isocyanate type, acid value, molar percentage of isocyanate charged Type TSI = toluene sulphonyl isocyanate
Type BSI = benzene sulphonyl isocyanate
Type PSI = propenyl sulphonyl isocyanate
Type CBSI = 4-chloro benzene sulphonyl isocyanate Column 4: diazo compound type, ratio of diazo to compound of the invention Type I = as in Example 6 of European patent specification No. 30862

Type II = diazo diphenyl amine-formaldehyde condensate

Column 5: developer type

Type W = an aqueous solution as described in Example 1 of GB Patent Specification No. 2068136

Type X = an aqueous solution of a surfactant containing 7% benzyl alcohol

Type Y = a mixture of a glycol ester and a surfactant as described in Example 8 of GB Patent Specification No. 1220808

Column 6: sensitivity

The sensitivity was determined using an IL 540 photometer marketed by International Light Inc and is the amount of radiation needed to produce, after inking, a solid step 4 when the plate was exposed through a continuous tone step-wedge.

Comparative Examples 1 and 2 in Table 1 give sensitivity and development characteristics for a composition based on a photocross-linkable compound and a diazo resin respectively.

EXAMPLE 17

Lithographic printing plates based on Examples 1, 2, 3, 6 and 15, and comparative Examples C1 and C2 were tested on a rotary web offset press and the results are shown in Table 2.

EXAMPLE 18

Examples 1 and 3 were repeated with the inclusion in the respective compositions of 10% w/w of 1,2-benzanthraquinone as sensitiser. It was found that a 30% increase in sensitivity was produced.

TABLE 1

| Example No. | 1 Type of Starting Polymer | 2 Azide acid | | | 3 Sulphonyl Isocyanate | | | 4 Diazo Compound | | 5 Developer | 6 Sensitivity |
|---|---|---|---|---|---|---|---|---|---|---|---|
| | | Type | % Ester | Mol % chgd | Type | Acid Value | Mol % chgd | Type | Ratio | Type | (mJ cm$^{-2}$) |
| 1 | A | 1 | 13.8 | 30 | TSI | 65 | 66 | — | — | W | 221 |
| 2 | A | 1 | 13.8 | 30 | TSI | 65 | 66 | I | 2.7:1 | W | 400 |

TABLE 1-continued

| Example No. | Type of Starting Polymer | Azide acid Type | % Ester | Mol % chgd | Sulphonyl Isocyanate Type | Acid Value | Mol % chgd | Diazo Compound Type | Ratio | Developer Type | Sensitivity* (mJ cm$^{-2}$) |
|---|---|---|---|---|---|---|---|---|---|---|---|
| 3 | B | 1 | 12.6 | 45 | TSI | 44 | 60 | — | — | X | 560 |
| 4 | B | 2 | 16.2 | 30 | TSI | 49 | 60 | — | — | X | 494 |
| 5 | B | 1 | 13.4 | 45 | BSI | 37 | 60 | I | 2.7:1 | X | 640 |
| 6 | A | 1 | 18.3 | 55 | TSI | 56 | 55 | I | 2.7:1 | X | 125 |
| 7 | D | 3 | 13.1 | 30 | TSI | 75 | 90 | II | 2.7:1 | W | 800 |
| 8 | C | 1 | 13.8 | 32 | PSI | 57 | 66 | — | — | W | 234 |
| 9 | E | 1 | 10.9 | 60 | BSI | 62 | 30 | I | 2.7:1 | W | 300 |
| 10 | E | 1 | 10.9 | 60 | BSI | 62 | 30 | I | 1:2 | W | 400 |
| 11 | A | 4 | 10.1 | 30 | BSI | 62 | 66 | — | — | W | 300 |
| 12 | A | 3 | 12.4 | 30 | TSI | 66 | 66 | — | — | W | 260 |
| 13 | A | 1 | 13.9 | 30 | CBSI | 39 | 60 | II | 1:2 | X | 200 |
| 14 | A | 1 | 13.8 | 30 | TSI | 65 | 66 | II | 1:2 | X | 200 |
| 15 | A | 3 | 12.4 | 30 | TSI | 66 | 66 | I | 1:2 | W | 200 |
| 16 | A | 5 | 11.7 | 40 | TSI | 60 | 66 | I | 1:2 | X | 220 |
| C1 | B | 2 | 30 | 70 | — | — | — | — | — | Y | 600 |
| C2 | — | — | — | — | — | — | — | II | — | W | 800 |

TABLE 2

| Example No. | No. of Impressions (unbaked) | No. of Impressions (baked) |
|---|---|---|
| 1 | 75 × 10$^3$ | 97 × 10$^3$ |
| 2 | 70 × 10$^3$ | 90 × 10$^3$ |
| 3 | 75 × 10$^3$ | ≧130 × 10$^3$ |
| 6 | 70 × 10$^3$ | 90 × 10$^3$ |
| 15 | 70 × 10$^3$ | 95 × 10$^3$ |
| C1 | 90 × 10$^3$ | ≧130 × 10$^3$ |
| C2 | 30 × 10$^3$ | 30 × 10$^3$ |

The baking was carried out at 200° C. for 10 minutes in accordance with the treatment described in BG Patent No. 1513368.

We claim:

1. A radiation-sensitive polymer comprising:
i) a plurality of first substituent groups selected from
a) groups of the general formula:

$$N_3-R(CR^1=CR^2)_a-(CR^3=CR^4)_b-COO^x-$$

attached at $O^x$ to carbon atoms of the polymer, wherein a and b are zero or 1 and a+b is at least 1; R represents an aromatic radical optionally substituted with a group or groups additional to the azido group; and $R^1$, $R^2$, $R^3$ and $R^4$, which may be the same or different, represent halogen atoms, hydrogen atoms, cyano groups, alkyl groups, aryl groups, alkoxy groups, aryloxy groups, aralkyl groups or aralkoxy groups provided that at least one of the groups $R^1$ to $R^4$ represents a halogen atom or a cyano group; and b) groups derived from an azide substituted N-phenyl anthranilic acid, and
ii) a plurality of second substituent groups of the general formula:

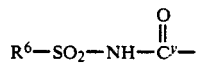

attached at $C^y$ to carbon atoms of the polymer where $R^6$ may be alkyl, alkoxy, aryloxy, or a tertiary amine group substituted with an alkyl or acyl radical having a 1-6 C atoms or an aryl radical having 6-10 C atoms.

2. A polymer as claimed in claim 1 wherein the first substituent groups are derived from
4-azido-α-bromo-δ-chlorocinnamylidene acetic acid
4-azido-α-chlorocinnamylidene acetic acid
4-azido-α-cyano-δ-chlorocinnamylidene acetic acid
4-azido-α-cyano-cinnamylidene acetic acid
3-azido-benzylidene-α-cynaoacetic acid
4-azido-2-chlorobenzylidene-α-cyanoacetic acid
4-azido-3,5-dibromobenzylidene-α-cyanoacetic acid
3-azido-4-methyl-benzylidene-α-cyanoacetic acid
3-azido-4-methoxybenzylidene-α-cyanoacetic acid
4-azido-benzylidene-α-bromo-cyanoacetic acid
4-azidobenzylidene-α-cyanoacetic acid
4-azido-3-chlorobenzylidene-α-cyanoacetic acid
or mixtures thereof.

3. A polymer as claimed in claim 1 wherein the polymer has attached thereto ester groups derived from non-azido-group containing aliphatic or aromatic carboxylic acids.

4. A polymer as claimed in claim 1 wherein the second substituent groups are derived from the groups comprising benzene sulphonyl isocyanate, p-chlorbenzene sulphonyl isocyanate and p-toluene sulphonyl isocyanate.

5. A radiation-sensitive composition comprising an admixture of a functional amount of a radiation-sensitive polymer as defined in claim 1, and a functional amount of at least one other radiation-sensitive compound.

6. A radiation-sensitive composition as claimed in claim 5 wherein the other radiation sensitive compound is a diazo compound or a polymer produced by the condensation of diazo diphenyl amine and formaldehyde.

* * * * *